United States Patent [19]

Yager

[11] 4,434,887
[45] Mar. 6, 1984

[54] ISOLATED STOP FOR VIBRATING FEEDERS

[75] Inventor: Glen E. Yager, Binghamton, N.Y.

[73] Assignee: Universal Instruments Corporation, Binghamton, N.Y.

[21] Appl. No.: 414,061

[22] Filed: Sep. 2, 1982

Related U.S. Application Data

[63] Continuation of Ser. No. 222,677, Jan. 5, 1981, abandoned.

[51] Int. Cl.³ ............................................. B65G 47/24
[52] U.S. Cl. ..................................... 198/391; 198/633
[58] Field of Search ............... 198/391, 396, 443, 474, 198/486, 580, 771, 382, 380, 389, 491, 492, 633, 345

[56] References Cited

U.S. PATENT DOCUMENTS

| | | | |
|---|---|---|---|
| 2,761,543 | 9/1956 | Brenneck et al. | 198/396 |
| 3,054,170 | 9/1962 | Benichasa et al. | 198/396 |
| 3,500,986 | 3/1970 | Schutt | 198/486 |
| 4,058,236 | 11/1977 | Brennan | 198/396 |
| 4,119,211 | 10/1978 | Boyer et al. | 198/486 |
| 4,182,030 | 1/1980 | Mullins | 198/389 |
| 4,206,539 | 6/1980 | Weresch | 198/391 |
| 4,282,965 | 8/1981 | Bates et al. | 198/380 |
| 4,282,966 | 8/1981 | Bates et al. | 198/382 |
| 4,328,887 | 5/1982 | Beard et al. | 198/492 |

*Primary Examiner*—Joseph E. Valenza
*Attorney, Agent, or Firm*—Fidelman, Wolffe & Waldron

[57] ABSTRACT

An apparatus is provided for feeding components by vibration, halting the feed of the components at an unload station, and picking-up the components by an unloader at the unload station in which the pick-up head and the means for stopping the feed of components is isolated from the vibrations of the feeder so that a uniform, accurate pick-up of components by the unloader is facilitated.

2 Claims, 3 Drawing Figures

ISOLATED STOP FOR VIBRATING FEEDERS

This is a continuation, of application Ser. No. 222,677, filed Jan. 5, 1981 (now abandoned).

BACKGROUND OF THE INVENTION

This invention relates generally to an improved means for feeding parts such as electronic components, by vibration, to an unload station of a vibratory feeder, and picking up the components by an unloader for a subsequent operation.

An example of such an apparatus is disclosed in U.S. Pat. No. 4,151,945 directed to placement of electronic components on a fluxed hybrid circuit substrate. In accordance with an automated program, the apparatus picks up individual components at a supply station such as a vibratory feeder by a vacuum pick-up head and translates these components to another location for population of a printed circuit board. In this patent, the pick-up head is used to orient and center each component, after selection and prior to placement. Although the apparatus of U.S. Pat. No. 4,151,945 provides means for orienting and centering each chip after selection and prior to placement, numerous other pick-up devices of this general nature do not provide means for orienting and centering the component; they rely upon the positioning of the component at the supply means prior to pick-up.

Numerous vibratory feeder bowls and vibratory linear feeder track devices have been used in an attempt to precisely position each chip, in turn, for pick-up by an unloader head. Examples of vibratory linear feeders are: U.S. Pat. No. 4,282,965, FEEDING AND ORIENTING DEVICE, Bates, et al. issued Aug. 11, 1981, and U.S. Pat. No. 4,282,966, FEEDING AND ORIENTING DEVICE, Bates, et al., issued Aug. 11, 1981.

Prior art vibratory feeders have provided a stop means which is integral with the feeder in order to stop the leading component in a position for pick-up by the unloader. Various problems have been encountered with this type of structure. For instance, when a component has reached the unload station and abuts the stop means, prior to pick-up, the stop means acts like a little hammer beating on the end of the part at an amplitude of vibration depending upon the setting of the feeder vibrator motor and the number of parts in the feeder. This constant, although small, vibration of a component against the stop means while at the unload station can cause inaccuracies in the pick-up of very small components and is detrimental to population of the printed circuit board. Further, since the feeder bed (usually supported on spring-metal strips) and the mass in the feeder changes each time one of the components is removed, the vibration amplitude changes. Stated another way, the amplitude of vibration changes as the number of parts in the feeder changes. Because of this dynamic change in vibration, it is difficult to compensate for the variable movement of the component (due to the "hammer" effect) that is engaging the stop in the unload station. This dyanamic change in vibration also requires the operator to constantly change the vibration motor setting as a means of compensation for the "hammer" effect. With a large number of parts in the feeder, it is necessary to reduce the amplitude of vibrations to obtain the necessary accuracy of pick-up, resulting in a subsequent loss of feed rate to the unload station. With a lesser number of parts in the feeder, a greater amplitude of vibration is required in order to keep the subsequent components fed up against the first component that is at the unload station; resulting in a "jittering", less smooth feed of components.

When dealing with very small components, such as miniature capacitors having no leads, the accuracy of positioning of the pick-up head with respect to the component that is at the unload station is critical for subsequent precise population of the printed circuit board.

SUMMARY OF THE PRESENT INVENTION

Accordingly, it is a primary object of the present invention to substantially eliminate the vibrations of the component at the unload station that cause inaccuracies in pick-up of the component by the unloader.

A more specific object of the invention is to provide a stop means which is isolated from the vibrations of the vibratory feeder so that the component at the unload station is forced up against a stop which is fixed in space, relative to the vibrating feeder, thus allowing an unloader to engage and pick-up the component with greater accuracy for subsequent population of a printed circuit board.

The instant invention, eliminates the "hammer" effect on the part that engages the stop means. Lowering or raising the amplitude of vibration of the feeder does not affect the isolated stop means. Hence, the apparatus of the instant invention allows changes in the amplitude of vibration while eliminating the "hammer" effect of the stop means upon the component which is at the unload station.

The specific nature of the invention as well as other objects, features, advantages and uses thereof will become apparent from the following detailed description of the preferred embodiment when taken in conjunction with the accompanying drawings.

DETAILED DESCRIPTION OF THE DRAWINGS

Like numerals and characters designate like elements throughout the drawings.

Figure 1:
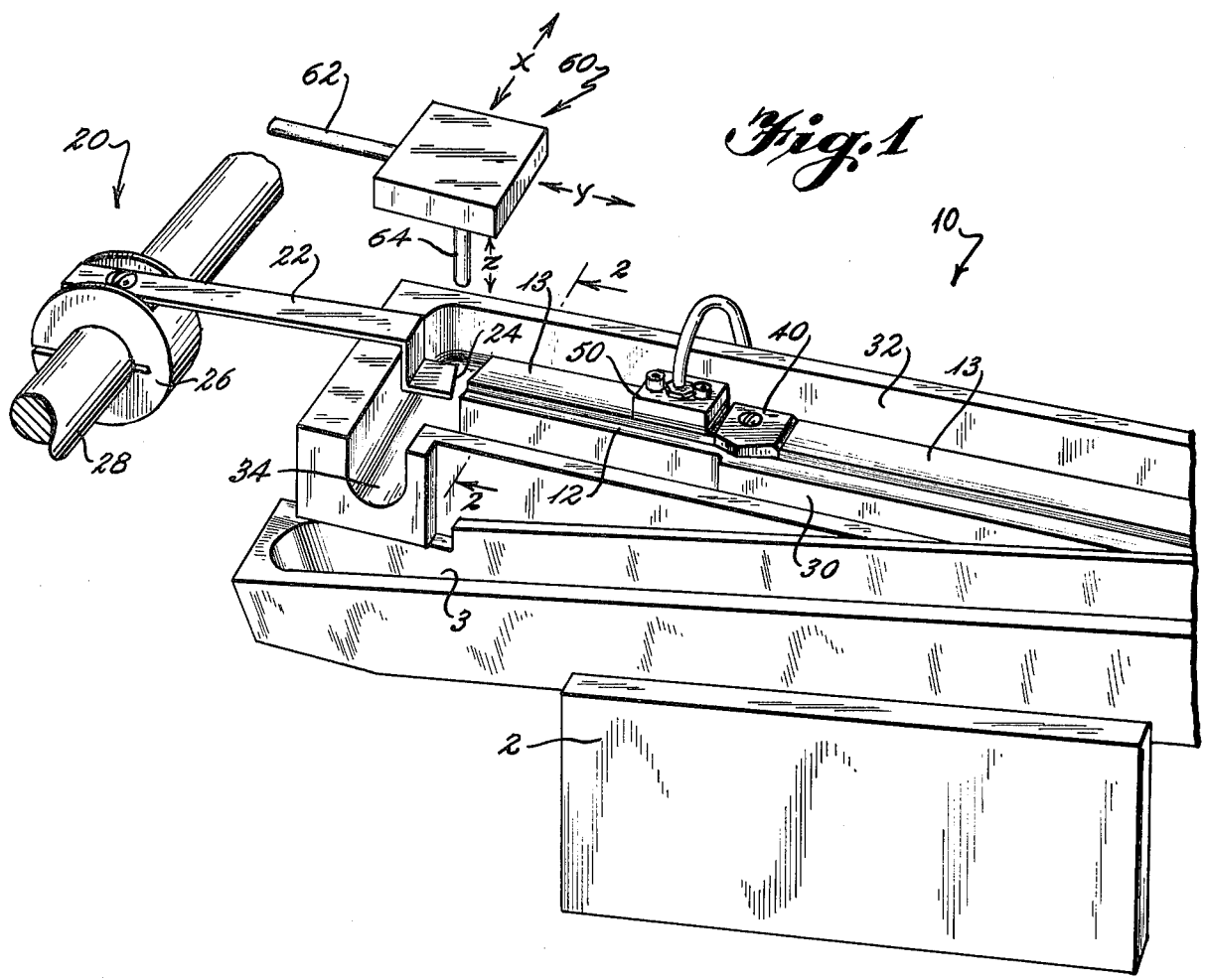
FIG. 1 is a perspective view, with parts omitted and partially cut away, of a vibratory linear feeder, stop means, and unload head.
Figure 2:
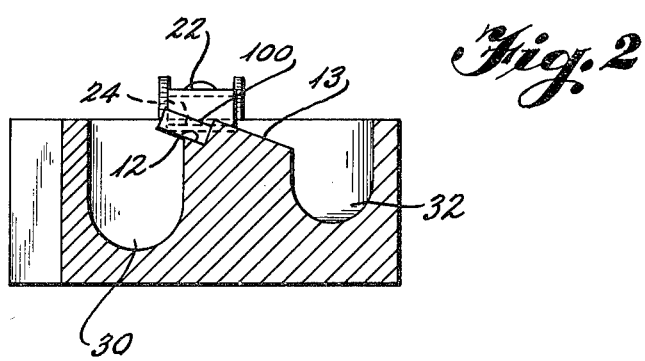
FIG. 2 is a cross-sectional view, along the lines 2—2 of FIG. 1, with the additional depiction of a typical component at the unload station.

Referring to FIG. 1 the major subassemblies of the apparatus are: a vibratory linear feeder 10, a stop assembly 20, and a pick-up head assembly 60. Feeder 10 includes a vibrator base, generally indicated at 2, to impart vibrations to the feeder bed 10 and a recirculation trough 3. Vibrations cause parts, such as miniature electronic components to ride up recirculation trough 3 (to the right in FIG. 1) and transfer into the loading end of feeder bed 10 (not shown). Properly oriented components are fed by these vibrations along a slanted guide shelf 12 (best seen in FIG. 2) and past first and second ejectors 40,50 such that the first component is engaged with the edge 24 of stop blade 22. From this unload station, the first (left-most) component is picked up by vacuum nozzle 64 of pick-up head assembly 60 for subsequent mounting on a printed circuit board. Components that are misoriented or improperly positioned on guide rail 12 are caused to fall off of guide rail 12 into return channels 30,32 for return via channel 34, to recirculation trough 3, thus providing a constant recirculation of these components.

In the embodiment disclosed in FIG. 1, ejector 40 limits the number of components that may be backed up along guide shelf 12 behind the first component which is abutting edge 24 of stop blade 22; this prevents the application of too much pressure on the first component due to the subsequent backed-up components and allows the first component to be removed by the pick-up head 60 without causing misorientation of subsequent components.

Vacuum pick-up head 60 is mounted on a support rod 62 for translation in all axes X, Y, Z as indicated in phantom lines on FIG. 1. Pick-up head support rod 62 is isolated from the vibrations imparted by vibratory base 2.

Stop assembly 20 includes a support rod 28, which is also isolated from the vibrations imparted by vibratory base 2, and a clamp 26 for securing stop blade 22 to rod 28. Blade 22 is angled to fit over the edge of feeder bed 10, such that it is never in contact with vibrating bed 10. In this manner, components that are fed along shelf 12 under the influence of the vibrations engage an immovable object, namely edge 24 of stop blade 22. As may be appreciated, stop assembly 20 is isolated from the vibrations of the feeder 10 such that edge 24 of the blade 22 does not act as a vibrating hammer on the first component.

The component that is forced up against edge 24 by subsequent components is relatively stationary in space such that vacuum nozzle 64 may be located in the same place for all components during pick-up, thus eliminating the need for centering fingers or the like on pick-up head 60 to properly orient the component after pick-up. Through a controller or the like, pick-up head 60 may be programmed to position itself directly above a component at the unload section (that position of a component in engagement with edge 24) for exact, centered pick-up of a component and for subsequent translation of the component to a printed circuit board for precise placement thereon.

Figure 3:
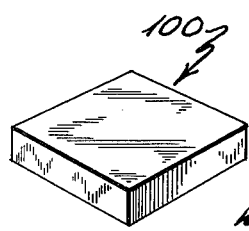
FIG. 3 is a plan view of a typical component.

Typical of the type of component handled by the apparatus of the instant invention is a lead-less microcapacitor 100, as seen in FIG. 3.

Although the drawings disclose only one embodiment, various alternatives to the basic structures are contemplated. For instance, rod 28 is normally rotatable about its longitudinal axis to pivot stop blade 22 away from the vibratory feeder for repair, adjustment, or replacement. Alternatively, blade 22 may be pivotal upon clamp member 26 or the like. Further, an adjustable support may be provided for blade 22 in order to adjust the verticle height of blade 22 relative to the height of feeder 10. Of course, pick-up head 60 could be provided with a means, other than a vacuum nozzle 64, for grasping the component.

Thus, the objects set forth above, among those made apparent from the preceding description, are efficiently attained and, since certain changes may be made in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, fall therebetween.

What is claimed as new and desired to be secured by Letters Patent is:

1. In an apparatus for vibratory feed of electrical components along a guide shelf of a vibrating feeder and into engagement with a stop means for halting said components at an unload station of said feeder and for pick-up of said parts on said feeder at said unload station by a pick-up head which is isolated from the vibrations of said feeder, said vibrating feeder comprising means for recirculating components which are misoriented and improperly positioned on said guide shelf, the improvement comprising:

support means for supporting said stop means, said support means being isolated from the vibrations of said feeder, whereby the vibrations of components at said unload station are minimized such that precise pick-up of said components on said feeder by said pick-up head is facilitated;

means for limiting the back-up of components on said guide shelf behind a component abutting said stop edge; and said stop means being configured to extend into said feeder such that an edge of said stop is adjacent and aligned with said guide shelf at said unload station and is pivotal away from said feeder for repair and adjustment access to said feeder.

2. An apparatus as in claim 1, wherein said stop means is adjustable relative to said feeder to accommodate different sizes of said components.

* * * * *